(12) United States Patent
Mayerl et al.

(10) Patent No.: US 11,994,891 B2
(45) Date of Patent: May 28, 2024

(54) VOLTAGE REGULATION BASED ON A FILTERED ANALOG VOLTAGE

(71) Applicant: Infineon Technologies AG, Neubiberg (DE)

(72) Inventors: Christoph Mayerl, Ottobrunn (DE); Albert Missoni, Graz (AT); Christoph Saas, Munich (DE)

(73) Assignee: Infineon Technologies AG, Neubiberg (DE)

( * ) Notice: Subject to any disclaimer, the term of this patent is extended or adjusted under 35 U.S.C. 154(b) by 80 days.

(21) Appl. No.: 17/522,038

(22) Filed: Nov. 9, 2021

(65) Prior Publication Data
US 2022/0147087 A1 May 12, 2022

(30) Foreign Application Priority Data
Nov. 10, 2020 (DE) .......................... 102020129614.2

(51) Int. Cl.
*G05F 1/575* (2006.01)
*G01R 19/165* (2006.01)
(Continued)

(52) U.S. Cl.
CPC ......... *G05F 1/575* (2013.01); *G01R 19/1659* (2013.01); *G05F 1/571* (2013.01); *G05F 3/262* (2013.01)

(58) Field of Classification Search
CPC .... H02H 7/122; H02H 7/1222; H02H 7/1225; H02H 7/1227; H02H 7/125; H02H 7/1252; H02H 7/1255; H02H 7/1257; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557;
(Continued)

(56) References Cited

U.S. PATENT DOCUMENTS 5,600,234 A * 2/1997 Hastings ............... H02M 3/156
323/285
6,127,815 A * 10/2000 Wilcox ................. H02M 3/156
323/351
(Continued)

FOREIGN PATENT DOCUMENTS

| DE | 102015118905 A1 | 5/2017 | |
| DE | 102017102499 A1 | 8/2018 | |
| WO | WO-2016004987 A1 * | 1/2016 | ............... G05F 1/56 |

OTHER PUBLICATIONS

German Patent Office, Office Action issued for DE 102020129614. 2, 7 pgs., dated May 5, 2021.

*Primary Examiner* — Kevin J Comber
*Assistant Examiner* — Nusrat Quddus
(74) *Attorney, Agent, or Firm* — Banner & Witcoff Ltd.

(57) ABSTRACT

A voltage regulating circuit including a conversion circuit configured to convert a voltage pulse sequence into a filtered analog voltage, wherein the voltage pulse sequence represents a predefined operating limiting voltage, and a regulator configured to receive the filtered analog voltage as regulation variable and to regulate an output voltage of the voltage regulating circuit to a predefined desired voltage.

17 Claims, 6 Drawing Sheets

(51) Int. Cl.
  *G05F 1/571* (2006.01)
  *G05F 3/26* (2006.01)

(58) Field of Classification Search
  CPC ........ G01R 19/16561; G01R 19/16566; G01R 19/16571; G01R 19/16576; G01R 19/1658; G01R 19/16585; G01R 19/1659; G01R 19/16595; G01R 19/17; H02M 1/32; H02M 2001/322; H02M 2001/327; H02M 1/34; H02M 2001/342; H02M 2001/344; H02M 2001/346; H02M 2001/348; H02M 1/36; H02M 1/38; H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; H02M 2001/4291; G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
  See application file for complete search history.

(56) References Cited

U.S. PATENT DOCUMENTS

| | | | |
|---|---|---|---|
| 6,333,623 B1 | 12/2001 | Heisley et al. | |
| 6,522,114 B1* | 2/2003 | Bakker | G05F 1/467 323/282 |
| 6,522,116 B1* | 2/2003 | Jordan | G05F 1/575 323/299 |
| 6,696,822 B2 | 2/2004 | Takabayashi | G11C 16/30 323/224 |
| 7,019,507 B1* | 3/2006 | Dittmer | H02M 1/32 323/284 |
| 7,221,213 B2* | 5/2007 | Lee | G05F 1/571 323/280 |
| 7,362,081 B1* | 4/2008 | Huang | G05F 1/575 323/282 |
| 8,044,653 B2* | 10/2011 | Maige | G05F 1/575 323/313 |
| 8,476,880 B2* | 7/2013 | Dong | H02M 3/33507 323/284 |
| 8,692,529 B1* | 4/2014 | Wyatt | G05F 1/56 323/280 |
| 9,547,323 B2* | 1/2017 | Bhattad | G05F 3/267 |
| 10,019,021 B1* | 7/2018 | Lee | H02M 3/158 |
| 10,061,337 B2* | 8/2018 | Mayerl | G05F 1/56 |
| 10,254,778 B1* | 4/2019 | Sambucco | G05F 1/575 |
| 10,386,877 B1* | 8/2019 | Magen | G05F 1/565 |
| 10,545,523 B1 | 1/2020 | Wu et al. | |
| 10,866,606 B2* | 12/2020 | Hu | G05F 1/575 |
| 10,866,607 B1* | 12/2020 | Avci | G01S 7/484 |
| 2006/0028188 A1* | 2/2006 | Hartular | H02M 3/156 323/273 |
| 2009/0116159 A1* | 5/2009 | Xu | H02M 1/32 361/91.1 |
| 2009/0302812 A1 | 12/2009 | Shor et al. | |
| 2011/0115556 A1* | 5/2011 | May | G05F 1/618 327/540 |
| 2011/0181256 A1* | 7/2011 | Ulbrich | G05F 1/46 327/108 |
| 2012/0126773 A1* | 5/2012 | Philbrick | H02M 3/158 323/286 |
| 2012/0223685 A1* | 9/2012 | Tsai | G05F 1/563 323/270 |
| 2013/0082675 A1* | 4/2013 | Capodivacca | H05B 45/39 323/283 |
| 2015/0205314 A1* | 7/2015 | Hayashi | G05F 1/56 323/217 |
| 2016/0054747 A1* | 2/2016 | Cohen | H02M 3/07 713/300 |
| 2016/0161961 A1* | 6/2016 | El-Nozahi | G05F 1/56 323/280 |
| 2016/0291625 A1* | 10/2016 | Tripathi | G06F 1/3296 |
| 2017/0201175 A1* | 7/2017 | Chen | H02M 3/156 |
| 2017/0364111 A1* | 12/2017 | Flaibani | G05F 1/575 |
| 2018/0219484 A1* | 8/2018 | Mercer | H02M 3/158 |
| 2020/0081467 A1* | 3/2020 | Hu | G05F 1/575 |
| 2021/0124382 A1* | 4/2021 | Deka | G05F 1/461 |
| 2022/0137656 A1* | 5/2022 | Vangara | G05F 1/565 323/280 |
| 2022/0197321 A1* | 6/2022 | Tiagaraj | G05F 1/575 |
| 2022/0255431 A1* | 8/2022 | Nguyen | H02M 3/158 |

* cited by examiner

VOLTAGE REGULATION BASED ON A FILTERED ANALOG VOLTAGE

FIELD OF THE DISCLOSURE

The disclosure relates to a voltage regulating circuit and to a method for operating a voltage regulating circuit.

BACKGROUND

A so-called low dropout regulator is a type of linear regulator for providing a stable output voltage, which optionally manages without an (external) capacitor and is then also referred to as "capless".

One challenge when designing such an integrated low dropout regulator (LDO) without an external capacitor is that of achieving a rapid regulation with (voltage) stability simultaneously being ensured across a wide range of operating states.

Stability requirements often restrict a regulation power to a degree at which a voltage integrity can no longer be guaranteed by the regulating control loop alone.

In order to prevent an excessively low or excessively high output voltage (VDD) under these conditions, additional measures may be necessary.

By way of example, a shunt can be provided in order to limit the output voltage VDD if it exceeds an upper voltage limit value (Vclip; also referred to as upper voltage threshold, upper limit value, upper threshold value, upper limit voltage or upper trigger threshold), and/or a stopper can be provided, which stops a clock signal generator (clock, or here system clock) if the output voltage VDD falls below a lower voltage limit value (Vdrop; also referred to as lower voltage threshold, lower limit value, lower threshold value, lower limit voltage or lower trigger threshold), which results in a reduction of the load.

All these limit values typically have local fluctuations in respect of the real voltage value at which, given a preset limit value, an envisaged action (e.g. connecting to the shunt or stopping the clock signal generator) is actually initiated.

Improving these fluctuations is limited by a current consumption and requirements stipulated for a performance of comparators used.

A range within which an output voltage VDD in a voltage regulating circuit in accordance with the prior art can vary is illustrated on the left-hand side in FIG. 1.

The total variation of the range of possible values of VDD results from the sum of the ranges of the individual values and lies between a minimum voltage (minimum output voltage) VDDmin and a maximum voltage (maximum output voltage) VDDmax.

In the case under consideration, the fluctuations are present at the voltage value generated by the regulator itself (illustrated as nominal output voltage VDDnom) and the two supporting circuit blocks that realize the lower limit voltage Vdrop and the upper limit voltage Vclip, respectively.

VDDnom must have a separation from each of Vdrop and Vclip, respectively, with a magnitude sufficient to ensure that an overlap does not occur in the case of the distributions (here by way of example in each case with a variation of 4σ), since otherwise the measures to be realized by the supporting circuit blocks would possibly be activated if the voltage set by the regulator is still within the permissible voltage range, e.g. within ±4σ around VDDnom.

In the case of technologies with feature sizes of significantly less than 1 micrometer, a maximum output voltage VDDmax decreases owing to more stringent requirements with regard to a reliability.

On the other hand, a limit voltage of MOS transistors, and thus also the minimum output voltage VDDmin, remains more or less the same in order to limit channel leakage.

Since the voltage control has to function within the thereby limited and decreased predefined voltage range (VDDmin-VDDmax), the fluctuation ranges around the individual predefined values (Vnom, Vdrop, Vclip) would have to be reduced in order to prevent an overlap of the fluctuation ranges.

SUMMARY

In various exemplary embodiments, a voltage regulating circuit is provided in which a regulation variable (also referred to as regulation target) for a low dropout regulator is not derived from an output voltage VDD, but rather from a duty cycle (also referred to as duty ratio) for overvoltage protection.

In various exemplary embodiments, a tolerable voltage fluctuation range of circuit elements in a voltage regulating circuit is increased and/or a voltage range (VDDmax-VDDmin) to be complied with by the output voltage is decreased, without the tolerable voltage fluctuation ranges of the individual circuit elements being significantly decreased, by virtue of the fact that a number of limit values used for the voltage regulation or limiting is reduced from three to two.

In various exemplary embodiments, a limit value for upper or lower voltage limiting can be used to derive a regulation variable therefrom. It is thus possible to dispense with predefining a target voltage value which, in the prior art, is based on a feedback signal generated by means of resistors as regulation variable.

BRIEF DESCRIPTION OF THE DRAWINGS

Exemplary embodiments of the disclosure are illustrated in the figures and are explained in greater detail below.

In the figures.

DETAILED DESCRIPTION

In the following detailed description, reference is made to the accompanying drawings, which form part of this description and show for illustration purposes specific embodiments in which the disclosed subject matter can be implemented. In this regard, direction terminology such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosed subject matter. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, insofar as this is expedient.

Figure 1:
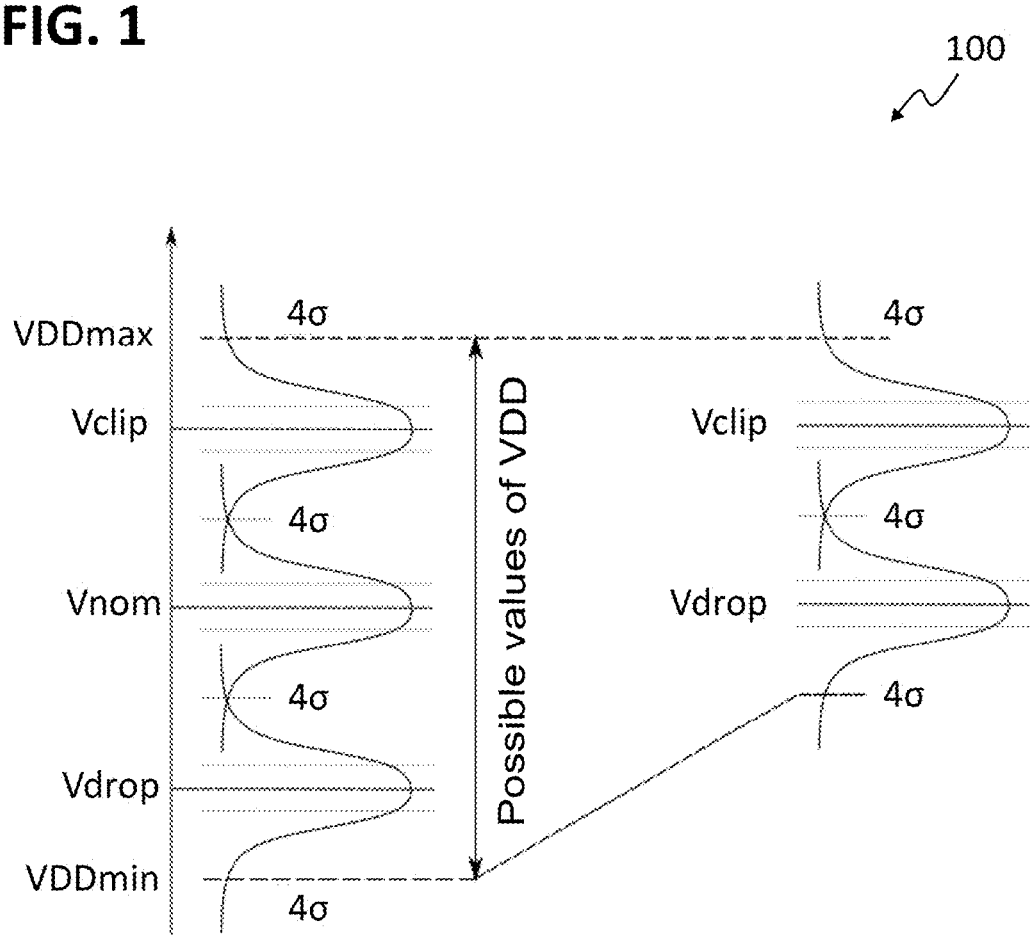
FIG. 1 shows illustrations of possible values for an output voltage provided by a voltage regulating circuit, in accordance with a prior art on the left and in accordance with various exemplary embodiments on the right.

FIG. 1 illustrates on the right-hand side possible values for an output voltage provided by a voltage regulating circuit in accordance with various exemplary embodiments.

As mentioned above, in various exemplary embodiments, a tolerable voltage fluctuation range of circuit elements in a voltage regulating circuit can be increased.

Alternatively or additionally, in various exemplary embodiments, a voltage range (VDDmax-VDDmin) to be complied with by the output voltage can be decreased, without the tolerable voltage fluctuation ranges of the individual circuit elements being significantly decreased.

Both independently of one another or jointly can be realized by virtue of the fact that a number of limit values used for the voltage regulation or limiting is reduced from three to two.

That is illustrated in FIG. 1.

Figure 2:
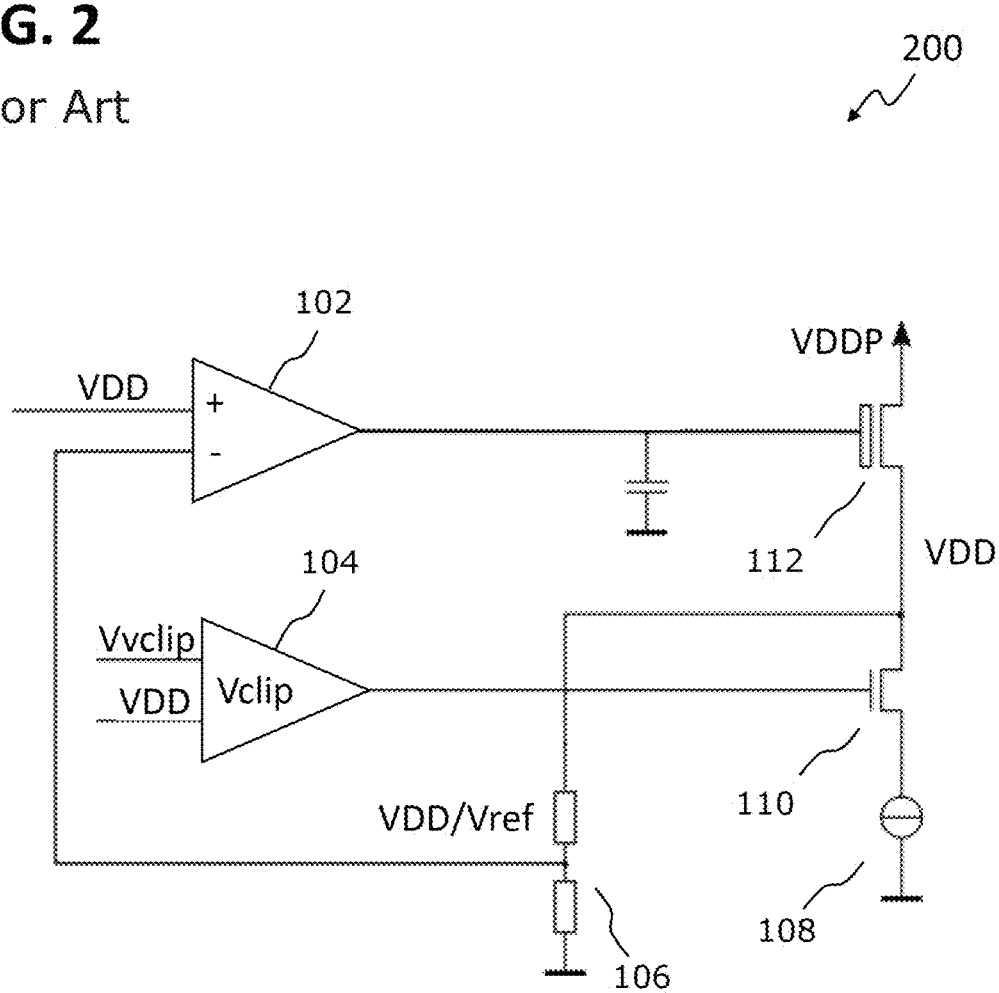
FIG. 2 shows a schematic circuit diagram of a voltage regulating circuit in accordance with a prior art.

The left-hand half of FIG. 1 illustrates three limit values which are typically used in a voltage regulating circuit in accordance with a prior art, for example a voltage regulating circuit 200 such as is illustrated in FIG. 2 on the basis of its schematic circuit diagram, for regulating the output voltage VDD.

In the case of the voltage regulating circuit 200 in accordance with a prior art, a regulator 102 can be configured to regulate an output voltage VDD of the voltage regulating circuit 200 to a predefined desired voltage. For this purpose, the output voltage VDD can be fed back to the regulator 102 via a voltage divider 106, which predefines a voltage reference value Vref. The regulated output of the regulator 102 can be coupled to a circuit element 112 (e.g. a so-called pass device) and can control the latter such that the desired output voltage VDD is established. If VDD is higher than the upper limit voltage Vclip, a current sink 108 can be activated (e.g. by means of a switchable pass element 110) in order to decrease the output voltage VDD.

The three limit values are the nominal output voltage VDDnom as target variable, an upper limit voltage Vclip and a lower limit voltage Vdrop (not illustrated in FIG. 2). Each of these limit values, as explained above, has a fluctuation range, wherein a highest possible upper limit voltage should be at most at a maximum output voltage VDDmax, and a smallest possible lower limit voltage should not be below a minimum output voltage VDDmin, in order to enable or ensure a functioning of the voltage regulating circuit and/or of a circuit that is supplied with voltage by the latter.

A sum of the fluctuation ranges results in a (minimum) variation (VDDmax-VDDmin) of a value range that VDD can assume.

As elucidated by the exemplary embodiment illustrated on the right-hand side in FIG. 1, dispensing with explicitly predefining the nominal output voltage makes it possible to decrease the value range that VDD can assume by comparison with the prior art, even though the fluctuation ranges of the two remaining limit values Vclip and Vdrop have remained with the same magnitudes. If, as shown in the exemplary embodiment illustrated, the value of the maximum output voltage VDDmax is maintained, that means that the value of the minimum output voltage VDDmin can be raised, which can mean an increase in the performance of the voltage regulating circuit 300 for the circuit parts supplied by the output voltage.

Conversely, if the value of the minimum output voltage VDDmin is maintained, the value of the maximum output voltage VDDmax can be lowered.

Alternatively, it is possible (not illustrated) to increase the fluctuation ranges of the two remaining limit values Vclip and Vdrop, which enables less stringent requirements in respect of the corresponding circuit elements.

In a further alternative exemplary embodiment, the exemplary embodiments above can be combined in order both to decrease the value range and to increase the fluctuation ranges.

To put it more generally, in various exemplary embodiments, the decreased value range to which VDD can be brought can make it possible to define a position and actual variation of the value range relative to the voltage values VDDmax and VDDmin which the output voltage VDD should not exceed and fall below, respectively, and which can be defined by requirements in respect of a maximum reliability of the voltage regulating circuit (e.g. VDDmax as overvoltage protection).

Vclip can be realized by means of a shunt, for example, and Vdrop by means of a stopper, which stops a clock signal generator if the output voltage VDD falls below the lower voltage limit value Vdrop.

In various exemplary embodiments, VDDnom is not required. Instead VDD can be kept in the target range between VDDmin and VDDmax on the basis of Vclip or Vdrop.

In various exemplary embodiments in which Vclip is used to keep VDD between VDDmin and VDDmax, VDD can typically lie closer to Vclip than to Vdrop (and thus also closer to VDDmax, in particular closer to VDDmax than to VDDmin). As considered illustratively, in such a case, the upper value of the fluctuation range around the (indirectly predefined) nominal output voltage VDDnom can coincide with the upper value of the fluctuation range of the upper voltage limit value Vclip, that is to say with VDDmax.

In various exemplary embodiments in which Vdrop is used to keep VDD between VDDmin and VDDmax, VDD can typically lie closer to Vdrop than to Vclip (and thus also closer to VDDmin, in particular closer to VDDmin than to VDDmax). As considered illustratively, in such a case, the lower value of the fluctuation range around the (indirectly predefined) nominal output voltage VDDnom can coincide with the lower value of the fluctuation range of the lower voltage limit value Vdrop, that is to say with VDDmin.

Figure 3:
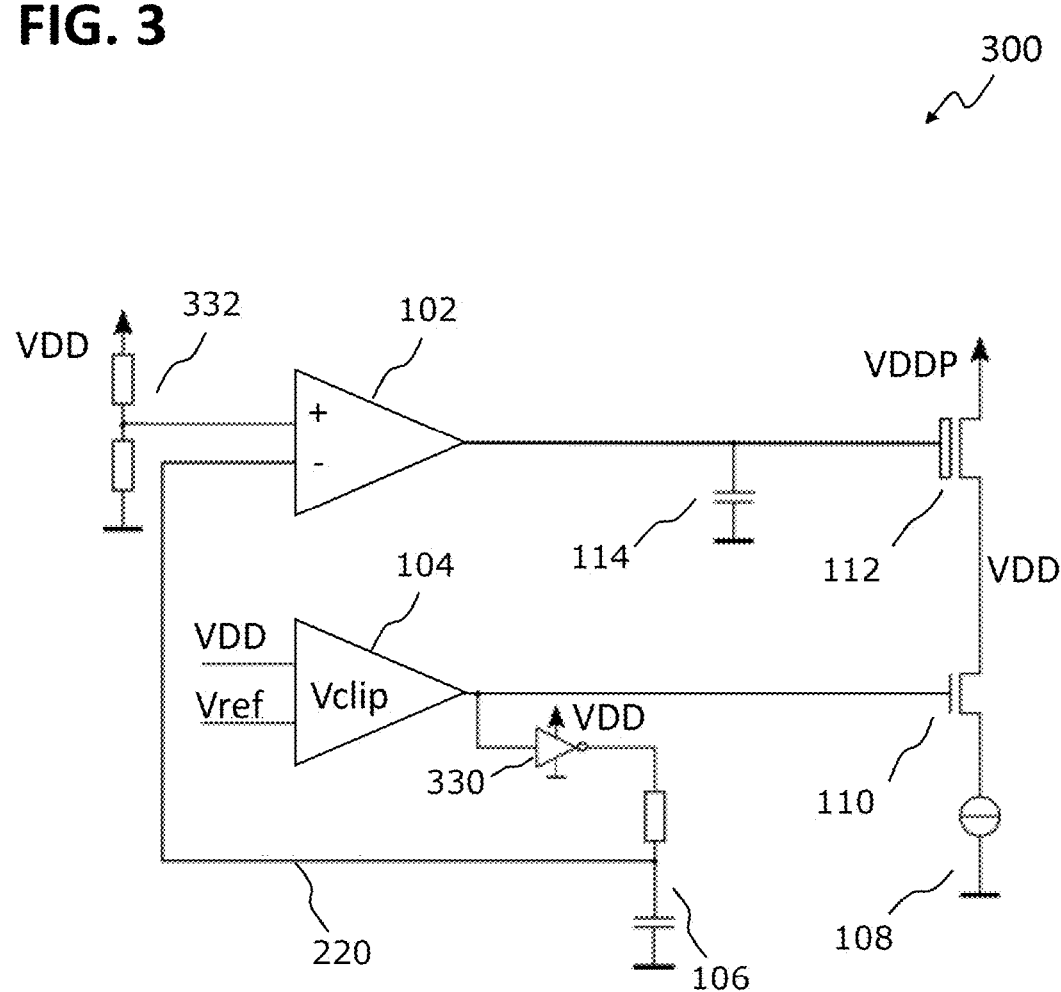
FIG. 3 shows a schematic circuit diagram of a voltage regulating circuit in accordance with various exemplary embodiments.
Figure 4:
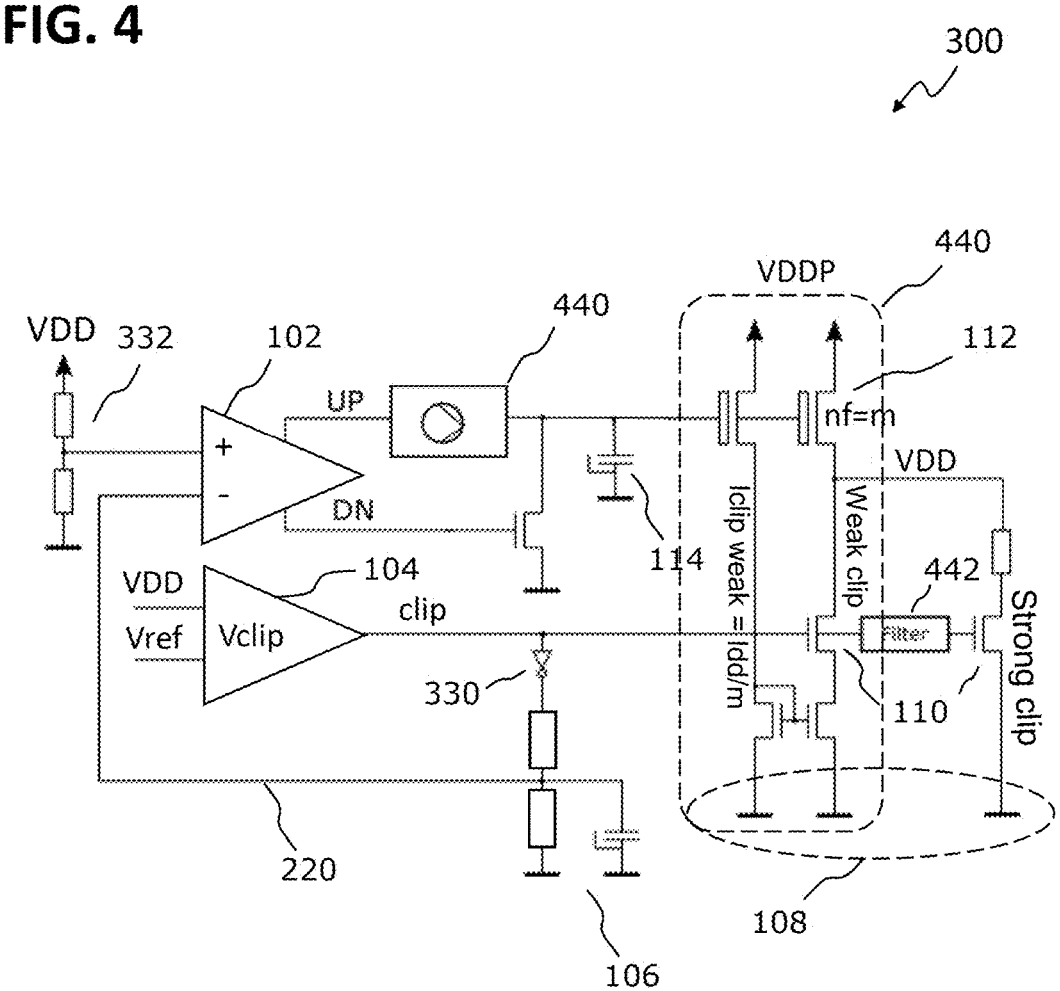
FIG. 4 shows a schematic circuit diagram of a voltage regulating circuit in accordance with various exemplary embodiments.

Each of FIG. 3 and FIG. 4 shows a schematic circuit diagram of a voltage regulating circuit 300 in accordance with various exemplary embodiments in which Vclip is used to regulate the output voltage VDD.

The voltage regulating circuit 300 can comprise a conversion circuit 106 (e.g. a low-pass filter) configured to convert a voltage pulse sequence into a filtered analog voltage. The conversion circuit 106 can thus act as a D/A converter.

In this case, the voltage pulse sequence—and accordingly also the filtered analog voltage—can represent a predefined operating limiting voltage Vclip, even if, as in the exemplary embodiment illustrated in FIG. 3 and FIG. 4, the voltage pulse sequence is inverted prior to conversion by means of an inverter 330.

The voltage regulating circuit 300 can furthermore comprise a regulator 102, for example a regulating amplifier, which can be configured to receive the filtered analog voltage as regulation variable and to regulate an output voltage of the voltage regulating circuit 300 to a predefined desired voltage.

In the case of the voltage regulating circuits 300 in accordance with various exemplary embodiments, it is possible (in comparison with the voltage regulating circuit 200 in accordance with the prior art) for a regulation variable no longer to be tapped off at the output voltage VDD, rather the regulation variable can be derived from an upper voltage limit value Vclip by virtue of the fact that a duty cycle representing Vclip as a digital signal is fed to a low-pass filter 106, which converts the duty cycle into an analog voltage, which is fed to the regulator 102 as regulation variable (by means of the feedback 220).

A comparison value for the regulator 102 that can form an analog equivalent of a target duty cycle can be provided by means of the output voltage VDD fed to a voltage divider 332.

The predefined desired voltage can lie between the upper limiting voltage Vclip and a lower limiting voltage Vdrop, wherein the predefined desired voltage can lie closer to the upper limiting voltage Vclip than to the lower limiting voltage Vdrop.

The regulated output of the regulator 102 can be coupled to a circuit element (pass device, e.g. a MOSFET) 112 connected to an external voltage VDDP and can control it such that the desired output voltage VDD is established.

In various exemplary embodiments, the output signal of the regulator 102 can be averaged by means of a capacitor 114.

Furthermore, in various exemplary embodiments, the output signal can be fed to a gate of the MOSFET 112 in order to control a current through the circuit element 112.

In various exemplary embodiments, the voltage regulating circuit 300 furthermore comprises an overvoltage protective circuit 104, 110, 108 configured to compare the output voltage VDD with the upper limiting voltage Vclip (in a comparator 104) and to output the voltage pulse sequence as comparison result (in the form of the duty cycle).

The duty cycle can correspond to a ratio of the upper limiting voltage Vclip and the output voltage VDD to one another. In the event of the upper limiting voltage Vclip being exceeded, the voltage pulse sequence (the duty cycle signal) can be used to connect the output voltage VDD to a current sink 108.

For this purpose, in various exemplary embodiments, e.g. by means of a switchable pass element 110, e.g. a MOSFET, a current sink 108 can be activated in order to decrease the output voltage VDD.

The upper limiting voltage Vclip (and optionally the supply voltage VDDP fed in externally) can be configured such that the output voltage VDD is connected to the current sink 108 on average for a predefined percentage of greater than 0% and less than 100%, for example between 1% and 90%, for example between 10% and 80%, for example between 20% and 50% of an operating duration of the voltage regulating circuit 300.

While FIG. 3 substantially elucidates a functional principle of the voltage regulating circuit 300 on the basis of a rough schematic diagram, FIG. 4 illustrates a more detailed exemplary embodiment.

In various exemplary embodiments, the circuit element 112 (pass device) can be a high-voltage NMOS transistor, for example an N-channel transistor, one terminal of which (e.g. drain D) can be coupled to the external voltage supply VDDP and which can provide the output voltage VDD at another of its terminals (e.g. source S).

The regulation variable is formed by the duty cycle of the clip signal. To put it another way, the duty cycle or a value derived therefrom is fed to the regulator 102 as regulation variable.

The duty cycle (fed to the regulator 102 as an analog signal) indicates a VDD value that is higher than a reference value Vref which should not be exceeded by the output voltage VDD. The upper limiting voltage Vclip of the output voltage VDD is limited by a current through a voltage sink (shunt) 108, which carries away a defined current if the clip is active. The current carried away can be constant or can be varied depending on different operating points and/or conditions.

The exemplary embodiment furthermore shows a low bias current, designated by Iclip weak, which is carried away if VDD is higher than Vref.

In order to release a load current, the weak clip can activate an additional strong shunt in order to prevent an overvoltage.

In various exemplary embodiments, the current sink 110 can be formed as a current mirror. That is illustrated by way of example in FIG. 4. In FIG. 4, m denotes a number of fingers of the regulating transistor. Assuming that the output mirror has only one finger, this results in a ratio 1/m for the number of fingers in the two current paths, and thus also for the current ratio, as is indicated for Iclip weak in FIG. 4.

In an equilibrium state, the fast Vclip comparator 104 yields a digital Vclip signal having a high frequency.

This signal can be filtered by means of a low-pass filter 106 in order to generate an analog representation of the duty cycle of the clip signal.

This analog signal is used as regulation variable. Therefore, the duty cycle of the clip signal in the equilibrium state is defined by the regulating control loop.

In the exemplary embodiment from FIG. 4, a charge pump 440 is provided as an additional component, said charge pump indicating as "UP" (for "upward") and "DN" (for "downward") the direction in which a control has to be effected as a function of the difference between the present clip duty cycle and the clip duty cycle striven for.

Figure 5:
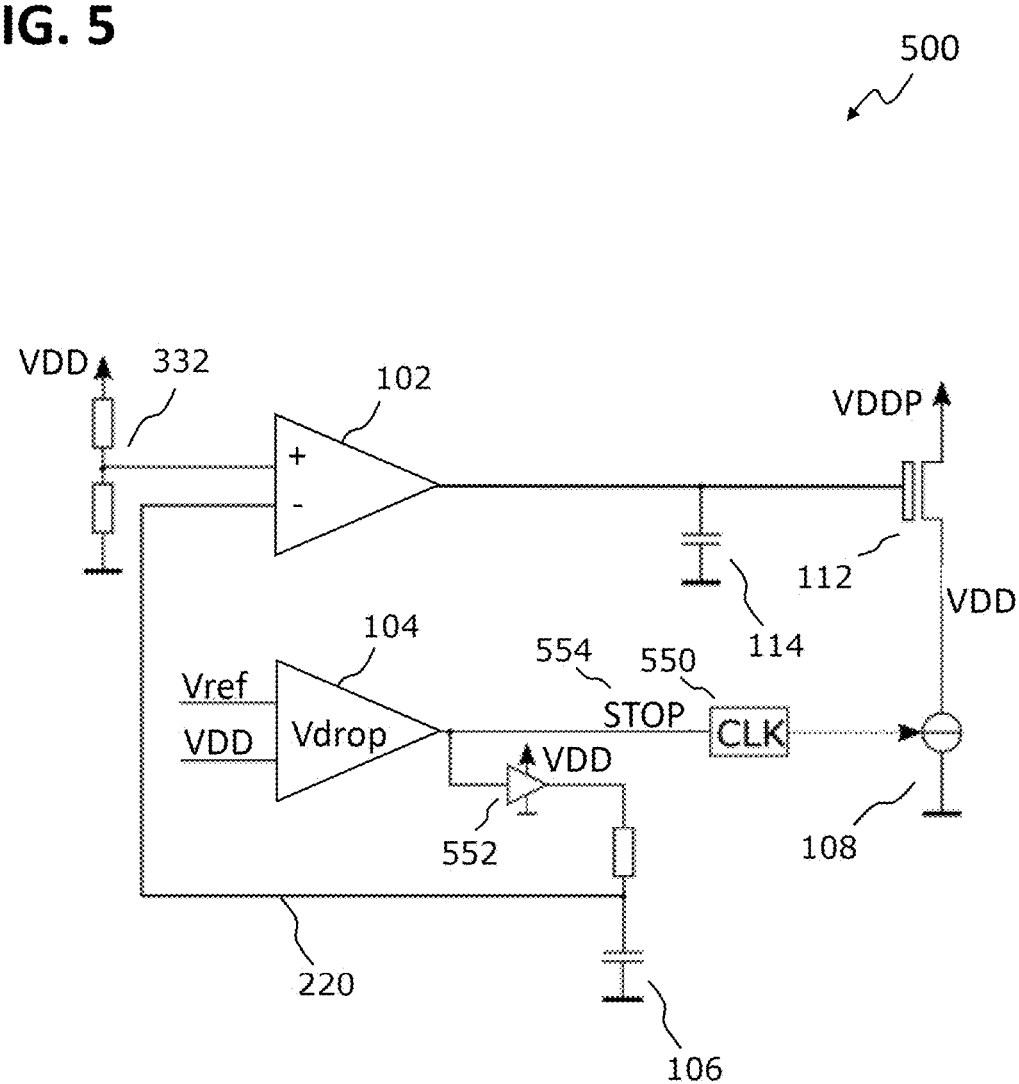
FIG. 5 shows a schematic circuit diagram of a voltage regulating circuit in accordance with various exemplary embodiments.

FIG. 5 shows a schematic circuit diagram of a voltage regulating circuit 500 in accordance with various exemplary embodiments in which Vdrop is used to regulate the output voltage VDD.

A basic functionality of the voltage regulating circuit 500, as described above in the general part, is similar to that of the voltage regulating circuits 300, and many circuit elements and functionalities are similar or identical to those described for the voltage regulating circuits 300, and so for the most part repetitions are dispensed with here.

One difference between the voltage regulating circuit 500 and the voltage regulating circuits 300 is that the reference voltage Vref provided to the comparator 104 for the comparison with VDD corresponds to the lower limiting voltage Vdrop and not to the upper limiting voltage Vclip.

In various exemplary embodiments, the voltage regulating circuit 500 furthermore comprises an undervoltage protective circuit 104, 108 configured to compare the output voltage VDD with the lower limiting voltage Vdrop (in a comparator 104) and to output the voltage pulse sequence as comparison result (in the form of the duty cycle).

The duty cycle can correspond to a ratio of the lower limiting voltage Vdrop and the output voltage VDD to one another. In the event of the lower limiting voltage Vdrop being undershot, the voltage pulse sequence (the duty cycle signal) can be used to increase the output voltage VDD again.

In order to make that possible, in various exemplary embodiments, a clock signal generator (clock) 550, which regularly connects the output voltage VDD to a current sink 108, can be provided as part of the voltage regulating circuit 500. If the comparator 104 ascertains that VDD falls below the lower limiting voltage Vdrop, the output signal of the comparator 104 can be fed to an interrupter (or delay element) 554, which can be configured to stop or at least delay the clock signal generator 550. As a result, the output voltage VDD is connected to the current sink 108 less frequently or is no longer connected to it at all and can rise again.

The current sink 108 in FIG. 5 is a model representation for the current consumption of a clocked circuit, the current consumption of which relevantly depends on the clock (e.g. CPU).

The lower limiting voltage Vdrop (and optionally the supply voltage VDDP fed in externally) can be configured such that the output voltage VDD is connected to the current sink 108 on average for a predefined percentage of greater than 0% and less than 100%, for example between 1% and 90%, for example between 10% and 80%, for example between 20% and 50% of an operating duration of the voltage regulating circuit 500.

In the case of the voltage regulating circuit 500, in a manner similar to that in the case of the voltage regulating circuits 300, the duty cycle can be fed to the regulator 102 as regulation variable. Here, too, the duty cycle can be converted to an analog signal (a voltage) by means of a D/A converter before being provided to the regulator 102, although inverting can be dispensed with.

The regulation variable can be processed substantially in just the same way as described above for the voltage regulating circuits 300, specifically by the output signal of the regulator 102 being fed to a circuit element 112 (e.g. a so-called pass device) and controlling it such that the desired output voltage VDD is established.

Figure 6:
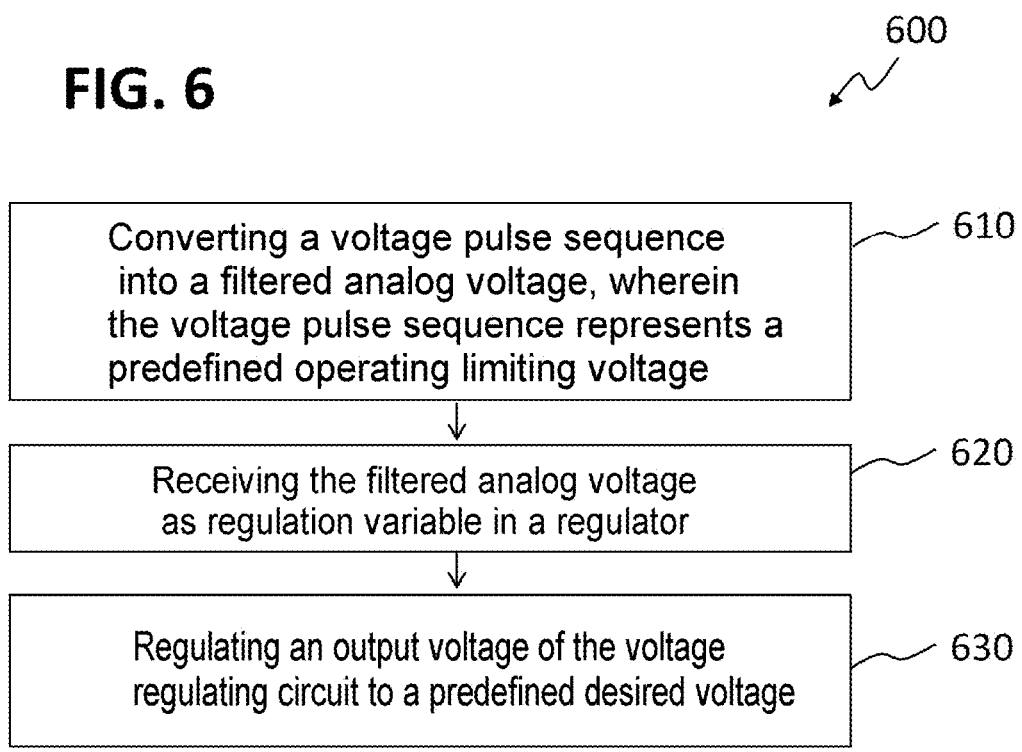
FIG. 6 shows a flow diagram of a method for operating a voltage regulating circuit in accordance with various exemplary embodiments.

FIG. 6 shows a flow diagram 600 of a method for operating a voltage regulating circuit in accordance with various exemplary embodiments.

The method comprises converting a voltage pulse sequence into a filtered analog voltage, wherein the voltage pulse sequence represents a predefined operating limiting voltage (at 610), receiving the filtered analog voltage as regulation variable in a regulator (at 620), and regulating an output voltage of the voltage regulating circuit to a predefined desired voltage (330).

Some exemplary embodiments are specified below in summary.

Exemplary embodiment 1 is a voltage regulating circuit. The voltage regulating circuit comprises a conversion circuit configured to convert a voltage pulse sequence into a filtered analog voltage, wherein the voltage pulse sequence represents a predefined operating limiting voltage, and a regulator configured to receive the filtered analog voltage as regulation variable and to regulate an output voltage of the voltage regulating circuit to a predefined desired voltage.

Exemplary embodiment 2 is a voltage regulating circuit in accordance with exemplary embodiment 1, wherein the conversion circuit comprises a low-pass filter.

Exemplary embodiment 3 is a voltage regulating circuit in accordance with exemplary embodiment 1 or 2, wherein the predefined operating limiting voltage is an upper limiting voltage.

Exemplary embodiment 4 is a voltage regulating circuit in accordance with exemplary embodiment 3, wherein the conversion circuit comprises an inverter.

Exemplary embodiment 5 is a voltage regulating circuit in accordance with exemplary embodiment 4, which furthermore comprises an overvoltage protective circuit configured to compare the output voltage with the upper limiting voltage and to output the voltage pulse sequence as comparison result.

Exemplary embodiment 6 is a voltage regulating circuit in accordance with exemplary embodiment 5, wherein the voltage pulse sequence corresponds to a duty cycle corresponding to a ratio of the upper limiting voltage and the output voltage to one another.

Exemplary embodiment 7 is a voltage regulating circuit in accordance with exemplary embodiment 5 or 6, which is furthermore configured to connect the output voltage to a current sink by means of the voltage pulse sequence in the event of the upper limiting voltage being exceeded.

Exemplary embodiment 8 is a voltage regulating circuit in accordance with exemplary embodiment 7, wherein the upper limiting voltage is configured such that the output voltage is connected to the current sink on average for a predefined percentage of greater than 0% and less than 100% of an operating duration of the voltage regulating circuit.

Exemplary embodiment 9 is a voltage regulating circuit in accordance with any of exemplary embodiments 3 to 8, wherein the predefined desired voltage lies between the upper limiting voltage and a lower limiting voltage.

Exemplary embodiment 10 is a voltage regulating circuit in accordance with exemplary embodiment 9, wherein the predefined desired voltage lies closer to the upper limiting voltage than to the lower limiting voltage.

Exemplary embodiment 11 is a voltage regulating circuit in accordance with exemplary embodiment 1 or 2, wherein the predefined limiting voltage is a lower limiting voltage.

Exemplary embodiment 12 is a voltage regulating circuit in accordance with exemplary embodiment 11, which furthermore comprises an undervoltage protective circuit configured to compare the output voltage with the lower limiting voltage and to output the voltage pulse sequence as comparison result.

Exemplary embodiment 13 is a voltage regulating circuit in accordance with exemplary embodiment 5, wherein the voltage pulse sequence corresponds to a duty cycle corresponding to a ratio of the lower limiting voltage and the output voltage to one another.

Exemplary embodiment 14 is a voltage regulating circuit in accordance with exemplary embodiment 12 or 13, which furthermore comprises a clock signal generator and a current sink, wherein the clock signal generator is configured to provide a clock signal for connecting the output voltage to the current sink in a clocked fashion.

Exemplary embodiment 15 is a voltage regulating circuit in accordance with exemplary embodiment 14, which is furthermore configured to stop the clock signal generator by means of the voltage pulse sequence in the event of the lower limiting voltage being undershot, in order to prevent the output voltage from being connected to the current sink.

Exemplary embodiment 16 is a voltage regulating circuit in accordance with any of exemplary embodiments 11 to 15, wherein the predefined desired voltage lies between the lower limiting voltage and an upper limiting voltage.

Exemplary embodiment 17 is a voltage regulating circuit in accordance with exemplary embodiment 16, wherein the predefined desired voltage lies closer to the lower limiting voltage than to the upper limiting voltage.

Exemplary embodiment 18 is a voltage regulating circuit in accordance with any of exemplary embodiments 1 to 17, which furthermore comprises a current mirror configured to output the output voltage.

Exemplary embodiment 19 is a voltage regulating circuit in accordance with exemplary embodiment 7, which furthermore comprises a current sink configured to decrease a current depending on the present load current of the voltage regulating circuit.

Exemplary embodiment 20 is a voltage regulating circuit in accordance with exemplary embodiment 19, wherein the current sink is formed by means of a current mirror.

Exemplary embodiment 21 is a method for operating a voltage regulating circuit. The method comprises converting a voltage pulse sequence into a filtered analog voltage, wherein the voltage pulse sequence represents a predefined operating limiting voltage, receiving the filtered analog voltage as regulation variable in a regulator, and regulating an output voltage of the voltage regulating circuit to a predefined desired voltage.

Exemplary embodiment 22 is a method in accordance with exemplary embodiment 21, wherein the converting comprises low-pass filtering.

Exemplary embodiment 23 is a method in accordance with exemplary embodiment 21 or 22, wherein the predefined operating limiting voltage is an upper limiting voltage.

Exemplary embodiment 24 is a method in accordance with exemplary embodiment 23, wherein the converting comprises inverting.

Exemplary embodiment 25 is a method in accordance with exemplary embodiment 23 or 24, which furthermore comprises comparing the output voltage with the upper limiting voltage and outputting the voltage pulse sequence as comparison result.

Exemplary embodiment 26 is a method in accordance with exemplary embodiment 25, wherein the voltage pulse sequence corresponds to a duty cycle corresponding to a ratio of the upper limiting voltage and the output voltage to one another.

Exemplary embodiment 27 is a method in accordance with exemplary embodiment 25 or 26, which furthermore comprises connecting the output voltage to a current sink in the event of the upper limiting voltage being exceeded.

Exemplary embodiment 28 is a method in accordance with exemplary embodiment 27, wherein the upper limiting voltage is configured such that the output voltage is connected to the current sink on average for a predefined percentage of greater than 0% and less than 100% of an operating duration of the voltage regulating circuit.

Exemplary embodiment 29 is a method in accordance with any of exemplary embodiments 23 to 28, wherein the predefined desired voltage lies between the upper limiting voltage and a lower limiting voltage.

Exemplary embodiment 30 is a method in accordance with exemplary embodiment 29, wherein the predefined desired voltage lies closer to the upper limiting voltage than to the lower limiting voltage.

Exemplary embodiment 31 is a method in accordance with exemplary embodiment 21 or 22, wherein the predefined limiting voltage is a lower limiting voltage.

Exemplary embodiment 32 is a method in accordance with exemplary embodiment 31, which furthermore comprises comparing the output voltage with the lower limiting voltage and outputting the voltage pulse sequence as comparison result.

Exemplary embodiment 33 is a method in accordance with exemplary embodiment 32, wherein the voltage pulse sequence corresponds to a duty cycle corresponding to a ratio of the lower limiting voltage and the output voltage to one another.

Exemplary embodiment 34 is a method in accordance with exemplary embodiment 32 or 33, which furthermore comprises providing a clock signal and connecting the output voltage to a current sink in a clocked fashion.

Exemplary embodiment 35 is a method in accordance with exemplary embodiment 34, which furthermore comprises stopping the clock signal generator in the event of the lower limiting voltage being undershot, in order to prevent the output voltage from being connected to the current sink.

Exemplary embodiment 36 is a method in accordance with any of exemplary embodiments 31 to 35, wherein the predefined desired voltage lies between the lower limiting voltage and an upper limiting voltage.

Exemplary embodiment 37 is a method in accordance with exemplary embodiment 36, wherein the predefined desired voltage lies closer to the lower limiting voltage than to the upper limiting voltage.

Further advantageous configurations of the device are evident from the description of the method, and vice versa.

The invention claimed is:

1. A voltage regulating circuit, comprising:
   an overvoltage or undervoltage protective circuit configured to compare an output voltage of the voltage regulating circuit with a limiting voltage, and to output a voltage pulse sequence as a comparison result,
   wherein the voltage pulse sequence represents a predefined operating limiting voltage and corresponds to a duty cycle corresponding to a ratio of the limiting voltage and the output voltage of the voltage regulating circuit to one another;
   a conversion circuit coupled directly to an output of the overvoltage or undervoltage protective circuit, and configured to convert the voltage pulse sequence into a filtered analog voltage; and
   a regulator configured to regulate the output voltage of the voltage regulating circuit to a predefined desired voltage by comparing the filtered analog voltage as a regulation variable with the output voltage of the voltage regulating circuit.

2. The voltage regulating circuit as claimed in claim 1, wherein the conversion circuit comprises a low-pass filter.

3. The voltage regulating circuit as claimed in claim 1, wherein the predefined operating limiting voltage is an upper limiting voltage.

4. The voltage regulating circuit as claimed in claim 3, wherein the conversion circuit comprises an inverter.

5. The voltage regulating circuit as claimed in claim 3, wherein the predefined desired voltage lies between the upper limiting voltage and a lower limiting voltage.

6. The voltage regulating circuit as claimed in claim 5, wherein the predefined desired voltage lies closer to the upper limiting voltage than to the lower limiting voltage.

7. The voltage regulating circuit as claimed in claim 1, further configured to connect the output voltage to a current sink by means of the voltage pulse sequence in an event of the limiting voltage, which is an upper limiting voltage, is exceeded.

8. The voltage regulating circuit as claimed in claim 7, wherein the current sink is configured to decrease a current depending on a present load current of the voltage regulating circuit.

9. The voltage regulating circuit as claimed in claim 8, wherein the current sink is formed by means of a current mirror.

10. The voltage regulating circuit as claimed in claim 1, wherein the predefined limiting voltage is a lower limiting voltage.

11. The voltage regulating circuit as claimed in claim 10, wherein the overvoltage or undervoltage protective circuit is an undervoltage protective circuit configured to compare the output voltage with the lower limiting voltage and to output the voltage pulse sequence as the comparison result.

12. The voltage regulating circuit as claimed in claim 1, further comprising:
a current mirror configured to output the output voltage.

13. A voltage regulating circuit, comprising:
a conversion circuit configured to convert a voltage pulse sequence into a filtered analog voltage, wherein the voltage pulse sequence represents a predefined operating limiting voltage, which is an upper limiting voltage;
a regulator configured to receive the filtered analog voltage as a regulation variable and to regulate an output voltage of the voltage regulating circuit to a predefined desired voltage; and
an overvoltage protective circuit configured to compare the output voltage with the upper limiting voltage and to output the voltage pulse sequence as a comparison result,
wherein the voltage regulating circuit is configured to connect the output voltage to a current sink by means of the voltage pulse sequence in an event of the upper limiting voltage being exceeded, and the upper limiting voltage is configured such that the output voltage is connected to the current sink on average for a predefined percentage of greater than 0% and less than 100% of an operating duration of the voltage regulating circuit.

14. A method for operating a voltage regulating circuit, the method comprising:
comparing, by overvoltage or undervoltage protective circuit, an output voltage of the voltage regulating circuit with a limiting voltage, and outputting a voltage pulse sequence as a comparison result,
wherein the voltage pulse sequence represents a predefined operating limiting voltage and corresponds to a duty cycle corresponding to a ratio of the limiting voltage and the output voltage to one another;
converting, by a conversion circuit coupled directly to an output of the overvoltage or undervoltage protective circuit, the voltage pulse sequence into a filtered analog voltage;
receiving the filtered analog voltage as regulation variable in a regulator; and
regulating the output voltage of the voltage regulating circuit to a predefined desired voltage by comparing the filtered analog voltage as a regulation variable with the output voltage of the voltage regulating circuit.

15. The method as claimed in claim 14, wherein the converting comprises low-pass filtering.

16. The method as claimed in claim 14, wherein the predefined operating limiting voltage is an upper limiting voltage.

17. The method as claimed in claim 16, wherein the converting comprises inverting.

* * * * *